(12) United States Patent
Chang (10) Patent No.: US 11,462,514 B2
(45) Date of Patent: Oct. 4, 2022

(54) MEMORY DEVICE WITH A THROUGH HOLE STRUCTURE, SEMICONDUCTOR DEVICE AND METHOD FOR MANUFACTURING THE SAME

(71) Applicant: Changxin Memory Technologies, Inc., Anhui (CN)

(72) Inventor: Chih-Wei Chang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/182,063

(22) Filed: Feb. 22, 2021

(65) Prior Publication Data
US 2021/0183820 A1    Jun. 17, 2021

Related U.S. Application Data

(63) Continuation of application No. PCT/CN2019/103362, filed on Aug. 29, 2019.

(30) Foreign Application Priority Data

Aug. 31, 2018   (CN) .......................... 201811015658.X
Aug. 31, 2018   (CN) .......................... 201821424715.4

(51) Int. Cl.
*H01L 25/065* (2006.01)
*H01L 21/027* (2006.01)
(Continued)

(52) U.S. Cl.
CPC ...... *H01L 25/0657* (2013.01); *H01L 21/0274* (2013.01); *H01L 21/76898* (2013.01);
(Continued)

(58) Field of Classification Search
CPC ............ H01L 25/0657; H01L 21/0274; H01L 21/76898; H01L 23/481; H01L 23/5283;
(Continued)

(56) References Cited

U.S. PATENT DOCUMENTS 10,157,891 B2    12/2018  Tsai et al.
11,171,117 B2 *  11/2021  Gao ........................ H01L 24/89
(Continued)

FOREIGN PATENT DOCUMENTS

CN     104733435 A    6/2015
CN     109087901 A    12/2018
(Continued)

OTHER PUBLICATIONS

PCT International Search Report and the Written Opinion dated Nov. 27, 2019, issued in related International Application No. PCT/CN2019/103362 (7 pages).

*Primary Examiner* — Mamadou L Diallo
(74) *Attorney, Agent, or Firm* — Sheppard Mullin Richter & Hampton LLP (57) ABSTRACT

A memory device, a semiconductor device and their manufacturing methods are provided. The method may include: providing a first die and a plurality of second dies, the first die having a first pad, each of the plurality of second dies having a second pad, each of the second pads having a through hole; stacking the plurality of second dies on the first die with the second pads aligned with the first pad. In any two adjacent second dies, the through hole closer to the first die is not larger than the through hole farther away; forming a connecting hole passing through the through holes, exposing the first pad, and comprising a plurality of hole sections; and forming a conductive body in the connecting hole. This method simplifies the manufacturing process, reduces the cost thereof, and improves the production yield.

19 Claims, 8 Drawing Sheets

(51) Int. Cl.
*H01L 21/768* (2006.01)
*H01L 23/48* (2006.01)
*H01L 23/528* (2006.01)
*H01L 23/00* (2006.01)
*H01L 25/00* (2006.01)

(52) U.S. Cl.
CPC ........ *H01L 23/481* (2013.01); *H01L 23/5283* (2013.01); *H01L 24/05* (2013.01); *H01L 24/08* (2013.01); *H01L 25/50* (2013.01); *H01L 2224/05124* (2013.01); *H01L 2224/05147* (2013.01); *H01L 2224/05184* (2013.01); *H01L 2224/08146* (2013.01); *H01L 2225/06544* (2013.01)

(58) Field of Classification Search
CPC ........ H01L 24/05; H01L 24/08; H01L 25/50; H01L 2224/05124; H01L 2224/05147; H01L 2224/05184; H01L 2224/08146; H01L 2225/06544; H01L 24/24; H01L 24/92; H01L 24/80; H01L 24/82; H01L 2224/05551; H01L 2224/05553; H01L 2224/05554; H01L 2224/05555; H01L 2224/05686; H01L 2224/08145; H01L 2224/24145; H01L 2224/244; H01L 2224/245; H01L 2224/80896; H01L 2224/82031; H01L 2224/82106; H01L 2224/9202; H01L 2224/9212; H01L 2224/94; H01L 2224/97; H01L 2225/06593

See application file for complete search history.

(56) References Cited

U.S. PATENT DOCUMENTS

| | | | |
|---|---|---|---|
| 2009/0267194 A1 | 10/2009 | Chen | |
| 2013/0277852 A1* | 10/2013 | Chen | H01L 25/0657 438/109 |
| 2013/0307160 A1* | 11/2013 | Farooq | H01L 27/0688 438/618 |
| 2017/0005000 A1* | 1/2017 | Beyne | H01L 21/76844 |
| 2017/0018485 A1* | 1/2017 | Prabhu | H01L 23/49541 |
| 2017/0018529 A1* | 1/2017 | Katkar | H01L 25/0657 |
| 2020/0273844 A1* | 8/2020 | Hirano | H01L 25/0657 |
| 2020/0294970 A1* | 9/2020 | Uh | H01L 24/80 |

FOREIGN PATENT DOCUMENTS

| | | |
|---|---|---|
| CN | 208655617 U | 3/2019 |
| JP | 2016-062951 A | 4/2016 |

* cited by examiner

Fig. 9 forming an isolating layer on an inner wall of the connecting hole, the isolating layer not covering the first pad and surfaces of the second pads facing away from the first die — S1410 forming a conductive body surrounded by the isolating layer, the conductive body covering the surfaces of the second pads not covered by the isolating layer — S1420

```
┌──────────────────────────────────────────────────────┐  S14210
│  covering the second die farthest from the first die with a │
│  conductive material layer, the conductive material layer   │
│              filling the connecting hole              │
└──────────────────────────────────────────────────────┘
                           │
┌──────────────────────────────────────────────────────┐  S14220
│     removing a portion of the conductive material layer     │
│              outside the connecting hole              │
└──────────────────────────────────────────────────────┘
```

MEMORY DEVICE WITH A THROUGH HOLE STRUCTURE, SEMICONDUCTOR DEVICE AND METHOD FOR MANUFACTURING THE SAME

CROSS-REFERENCE TO RELATED APPLICATIONS

This application is a continuation application of International Patent Application No. PCT/CN2019/103362, filed on Aug. 29, 2019, which is based on and claims priority of the Chinese Patent Applications No. 201811015658.4 and No. 201821424715.X, both filed on Aug. 31, 2018. The above-referenced applications are incorporated herein by reference in their entirety.

TECHNICAL FIELD

This disclosure relates generally to the field of semiconductor technologies and, more specifically, to a memory device, a semiconductor device and their manufacturing methods.

BACKGROUND

With rapid development in semiconductor technologies, chip stacking technologies have been widely adopted in various memory devices, such as dynamic random access memory (DRAM) devices. Conventionally, Through-Silicon Vias (TSVs) may be used to connect multiple stacked dies in the shortest connection path. More specifically, in conventional technologies, silicon channels may first be formed in each of the to-be-stacked dies, and conductive components may be formed in these silicon channels. Then the dies may be stacked over each other so that the conductive components in the corresponding silicon channels are connected, thereby connecting the dies.

However, forming a TSV on each die individually may significantly prolong the manufacturing process and introduce additional procedures and cost therein.

It is to be noted that the above information disclosed in this Background section is only for facilitating the understanding of the background of the inventive concept and therefore may contain information that does not form the prior art that is already known to a person of ordinary skill in the art.

SUMMARY

In view of the limitations of existing technologies described above, this disclosure provides a memory device, a semiconductor device and related manufacturing methods that address at least some of the aforementioned limitations.

Additional features and advantages of this inventive concept will become apparent from the following detailed description or may be in part learned by practicing the invention.

One aspect of this inventive concept is directed to a semiconductor device manufacturing method. The method may comprise: providing a first die and a plurality of second dies. The first die may have a first pad, each of the plurality of second dies may have a second pad, and each of the second pads may have a through hole.

The method may further comprise: stacking the plurality of second dies on the first die, forming a connecting hole going through the through holes, and forming a conductive body in the connecting hole.

The second pads may be aligned with the first pad. In any two adjacent second dies, the through hole closer to the first die may not be larger than the through hole farther away from the first die. The connecting hole may expose the first pad and comprise a plurality of hole sections each located in a corresponding second die. The hole section in a second die may have a same size as the through hole of the second pad in this second die. The conductive body may connect the first pad and the second pads.

In some embodiments, the connecting hole may be formed by a single perforation process.

In some embodiments, the forming a connecting hole may comprise: covering the second die farthest from the first die with a photoresist layer; exposing and developing the photoresist layer to expose the through hole of the second pad in the second die covered by the photoresist layer; etching the through hole exposed by the photoresist layer toward the first pad until the first pad is exposed; and removing the photoresist layer.

In some embodiments, the through holes of different second pads may have different sizes, and the forming a conductive body connecting the first pad and the second pads in the connecting hole may comprise: forming an isolating layer on an inner wall of the connecting hole, and forming a conductive body surrounded by the isolating layer. The isolating layer may not cover the first pad and surfaces of the second pads facing away from the first die, and the conductive body may cover the surfaces of the second pads not covered by the isolating layer.

In some embodiments, the forming an isolating layer on an inner wall of the connecting hole may comprise: forming an isolating material layer in the connecting hole, the isolating material layer covering surfaces of the first pad and the second pads within the connecting hole; and removing a portion of the isolating material layer on the first pad and on the surfaces of the second pads facing away from the first die.

In some embodiments, the forming a conductive body surrounded by the isolating layer may comprise: covering the second die farthest from the first die with a conductive material layer, the conductive material layer filling the connecting hole; and removing a portion of the conductive material layer outside the connecting hole.

In some embodiments, centers of the through holes and a center of the first pad may be collinear.

In some embodiments, the first pad and the second pads may each be made of a metallic material.

In some embodiments, the first pad and the second pads may each be made of any one of copper, aluminum and tungsten.

In some embodiments, the first die may comprise: a first substrate; and a first insulating layer disposed on the first substrate. The first pad may be embedded in a surface of the first insulating layer facing away from the first substrate. Each of the plurality of second dies may comprise: a second substrate; and a second insulating layer disposed on a side of the second substrate farthest away from the first die. The second pad may be embedded in a surface of the second insulating layer facing away from the second substrate. The second substrate of the second die closest to the first die may be disposed on the surface of the first insulating layer facing away from the first substrate, and the second substrates and the second insulating layers of the second dies may be stacked alternately one above another.

In some embodiments, the conductive body may be a Through-Silicon Via (TSV).

Another aspect of this inventive concept is directed to a semiconductor device. The semiconductor device may comprise: a first die having a first pad; and a plurality of second dies. Each of the plurality of second dies may have a second pad, and each of the second pads may have a through hole. The second dies may be stacked on the first die with the second pads aligned with the first pad. In any two adjacent second dies, the through hole closer to the first die may not be larger than the through hole farther away from the first die.

The semiconductor device may further comprise a connecting hole passing through the through holes and a conductive body in the connecting hole. The connecting hole may expose the first pad and comprise a plurality of hole sections each located in a corresponding second die. The hole section in a second die may have a same size as the through hole of the second pad in this second die. The conductive body may connect the first pad and the second pads.

In some embodiments, the through holes of different second pads may have different sizes, and the semiconductor device may further comprise an isolating layer disposed between an inner wall of the connecting hole and the conductive body. The isolating layer may not cover the first pad and surfaces of the second pads facing away from the first die.

In some embodiments, centers of the through holes and a center of the first pad may be collinear.

In some embodiments, the first pad and the second pads may each be made of a metallic material.

In some embodiments, the first pad and the second pads may each be made of any one of copper, aluminum and tungsten.

In some embodiments, the first die may comprise: a first substrate; and a first insulating layer disposed on the first substrate. The first pad may be embedded in a surface of the first insulating layer facing away from the first substrate. Each of the plurality of second dies may comprise: a second substrate; and a second insulating layer disposed on a side of the second substrate farthest away from the first die. The second pad may be embedded in a surface of the second insulating layer facing away from the second substrate. The second substrate of the second die closest to the first die may be disposed on the surface of the first insulating layer facing away from the first substrate. The second substrates and the second insulating layers of the second dies may be stacked alternately one above another.

In some embodiments, the conductive body may be a Through-Silicon Via (TSV).

Another aspect of this inventive concept is directed to a memory device comprising the semiconductor device of any of the aforementioned embodiments.

In the semiconductor device manufacturing method disclosed herein, a plurality of second dies can be stacked on a first die, and a connecting hole along a direction perpendicular to an upper surface of the first die and toward the first die may be formed to expose the first pad. A conductive body then may be formed in the connecting hole to connect the first die and the plurality of second dies. Compared to conventional methods in which each die needs to be individually and separately perforated, the number of perforation processes in this method can be substantially reduced, which simplifies the manufacturing process, reduces the manufacturing cost, and improves the production yield.

In the memory device and the semiconductor device disclosed herein, since in any two adjacent second dies, the through hole closer to the first die is not larger than the through hole farther away from the first die, the second dies thus can be stacked on the first die during the manufacturing process. Then a connecting hole along a direction perpendicular to the upper surface of the first die and toward the first die may be formed to expose the first pad, and a conductive body may be formed in the connecting hole to connect the first die and the plurality of second dies. Thus the second dies do not need to individually and separately go through a perforation process, which may substantially reduce the number of perforation processes needed in the manufacturing process. That may simplify the manufacturing process, reduce the manufacturing cost, and improve the production yield.

It is to be understood that both the foregoing general description and the following detailed description are exemplary and explanatory only and are not restrictive of this inventive concept.

BRIEF DESCRIPTION OF THE DRAWINGS

The accompanying drawings, which are incorporated in and constitute a part of the description, illustrate embodiments consistent with this disclosure and, together with the description, serve to explain the disclosed principles. It is apparent that these drawings present only some embodiments of this inventive concept and those of ordinary skill in the art may obtain drawings of other embodiments from them without exerting any creative effort.

LIST OF REFERENCE NUMERALS IN DRAWINGS

1: a first die; 11: a first pad; 12: a first substrate; 13: a first insulating layer;
2: a second die; 21: a second pad; 211: a through hole; 22: a second substrate; 23: a second insulating layer;
3: a connecting hole; 4: a conductive body; 5: an isolating layer;
100: a photoresist layer; 200: a conductive material layer.

DETAILED DESCRIPTION OF THE EMBODIMENTS

Exemplary embodiments will now be described more fully with reference to the accompanying drawings. However, these exemplary embodiments can be implemented in many forms and should not be construed as being limited to those set forth herein. Rather, these embodiments are presented to provide a full and thorough understanding of this inventive concept and to fully convey the concepts of the exemplary embodiments to others skilled in the art. Throughout the drawings, like reference numerals indicate identical or similar elements, so any duplicate description of them will be omitted.

Although relative terms such as "upper" and "lower" may be used herein to describe a spatial relationship of one component to another in a device shown in the drawings, they are used merely for the purpose of easy description based on, for example, the exemplary orientation depicted in the drawings. It is to be understood that if the illustrated device is turned upside down, then the component described as being "upper" will now be a "lower" component. When a certain structure is described as being "on" another structure, it is possible that the specific structure is either integrally formed on the other structure or disposed thereon "directly" or "indirectly" via an intermediate structure.

As used herein, the terms "a", "an" "the" and "said" are intended to mean that there are one or more elements/components/etc. As used herein, the terms "comprising" and "having" are intended to be used in an open-ended sense to mean that there are possibly other element(s)/component(s)/etc. apart from the listed element(s)/component(s)/etc. The terms "first", "second", etc. as used herein are meant as labels rather than place a quantitative limitation upon the amount of the mentioned items.

This inventive concept first presents a method for manufacturing a semiconductor device. Examples of the semiconductor device may include, but not limited to, chip stacks such as dynamic random access memory (DRAM) devices, and will not be exhaustively enumerated herein.

Figure 1:
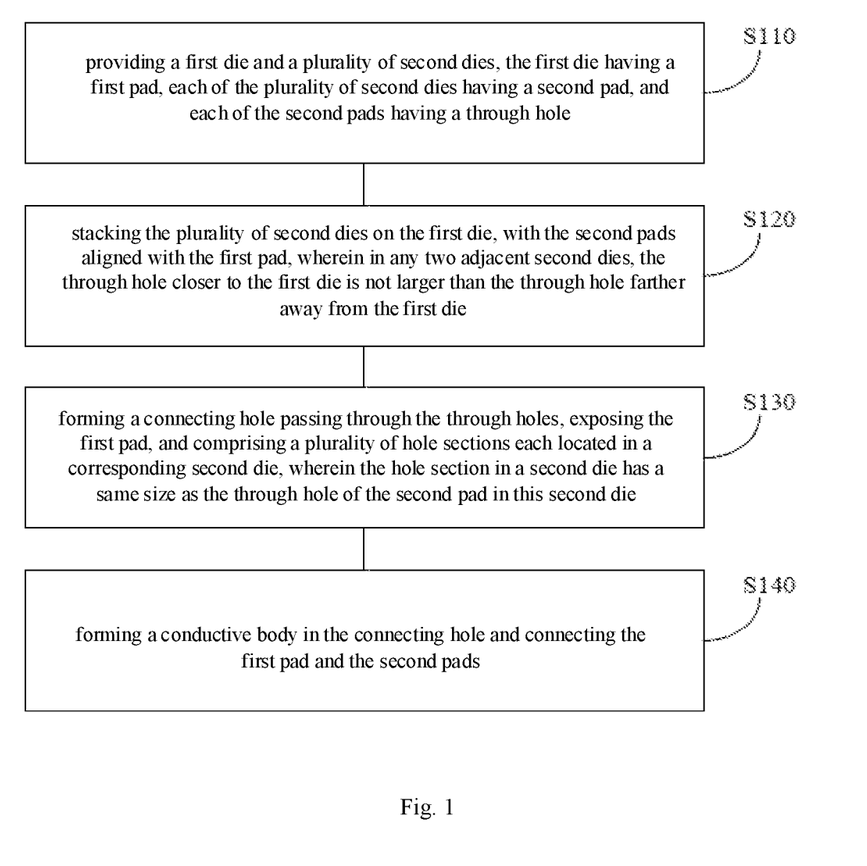
FIG. 1 is a flow diagram illustrating a semiconductor device manufacturing method in accordance with one embodiment of this inventive concept.

FIG. 1 is a flow diagram illustrating a semiconductor device manufacturing method in accordance with one embodiment of this inventive concept.

Referring to FIG. 1, the method may include steps S110 through S140.

In step S110, a first die and a plurality of second dies may be provided. The first die may have a first pad, each of the plurality of second dies may have a second pad, and each of the second pads may have a through hole. The through holes of the second pads may have at least two different sizes. In this application, a "die" (e.g., the first die or the second die) may refer to a semiconductor die on a wafer before the wafer is sliced, or a semiconductor die sliced from a wafer after the wafer is sliced. This inventive concept is not limited in this regard.

In step S120, the plurality of second dies may be stacked on the first die. The second pads may be aligned with the first pad. In any two adjacent second dies, the through hole closer to the first die may not be larger than the through hole farther away from the first die.

In step S130, a connecting hole passing through the through hole may be formed. The connecting hole may expose the first pad, and comprise a plurality of hole sections each located in a corresponding second die. The hole section in a second die may have a same size as the through hole of the second pad in this second die.

In step S140, a conductive body may be formed in the connecting hole. The conductive body may connect the first pad and the second pads.

In the semiconductor device manufacturing method disclosed herein, the plurality of second dies may be stacked on the first die, and a connecting hole along a direction perpendicular to an upper surface of the first die and toward the first die may be formed to expose the first pad. A conductive body then may be formed in the connecting hole to connect the first die and the second dies. Compared to conventional methods in which the dies need to be individually and separately perforated, the number of perforation processes in this method can be substantially reduced, which simplifies the manufacturing process, reduces the manufacturing cost, and improves the production yield.

The steps of the method are described in greater details below.

Referring to FIGS. 2, 3, 4, and 5, in step S110, the first die 1 and the second die 2 may be provided. The number of the first die 1 may be one. The first die 1 may have a first pad 11. The first pad 11 may be coupled to electrical circuits on the first die 1.

Figure 2:
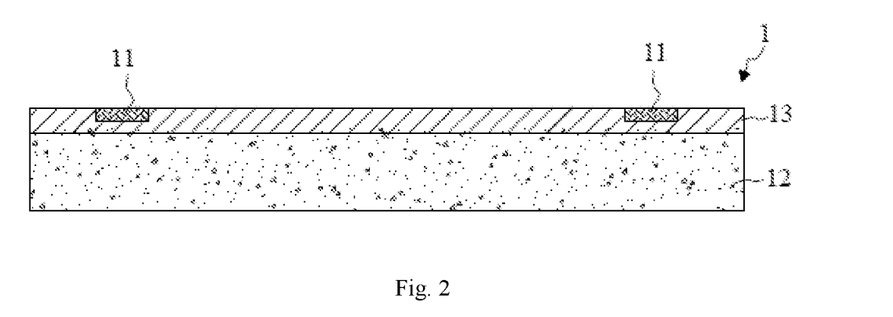
FIG. 2 is a schematic diagram of a first die in a semiconductor device manufacturing method in accordance with one embodiment of this inventive concept.
Figure 3:
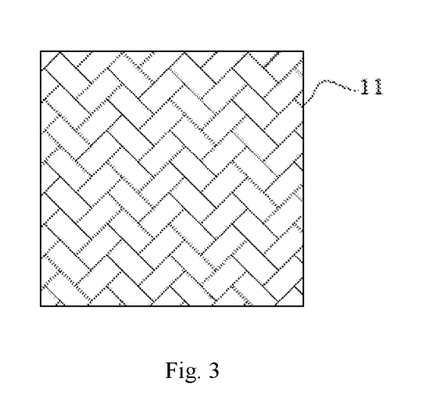
FIG. 3 is a schematic diagram of a first pad of the first die in a semiconductor device manufacturing method in accordance with one embodiment of this inventive concept.

In one example, as shown in FIGS. 2 and 3, the first die 1 may include the first pad 11, a first substrate 12 and a first insulating layer 13.

The first substrate 12 may be made of silicon or any other suitable semiconductor material, and may have any suitable shape or size. This inventive concept is not limited in these regards.

The first insulating layer 13 may be located on the first substrate 12 and may be made of a material such as silica or silicon nitride, or a mixture of several insulating materials.

The first pad 11 may be provided on a surface of the first insulating layer 13 facing away from the first substrate 12. The first pad 11 may be embedded in the first insulating layer 13, with its upper surface flush with the surface of the first insulating layer 13 facing away from the first substrate 12. The first pad 11 may be made of a metallic material such as copper, aluminum or tungsten. Apparently, the first pad 11 may also be made of other metallic materials not enumerated herein. The first pad 11 may be rectangular in a plan view. The first pad 11 may also be circular or other shapes in a plan view. The first die 1 may have one or more first pads 11.

Figure 4:
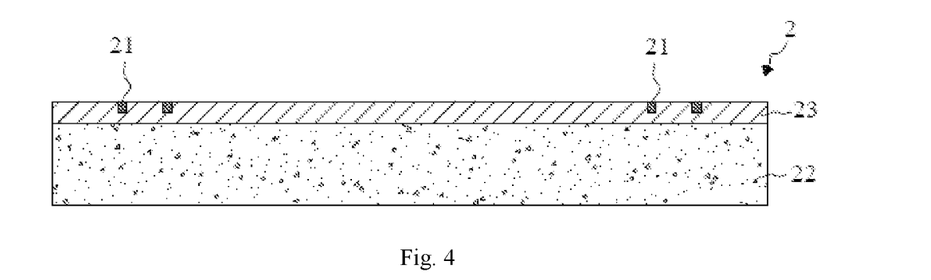
FIG. 4 is a schematic diagram of a second die in a semiconductor device manufacturing method in accordance with one embodiment of this inventive concept.

The number of the second die 2 may be more than one, that is, a plurality of second dies 2 may be provided. Referring to FIG. 4, each of the plurality of second dies 2 may have a second pad 21, and each of the second pad 21 may have a through hole 211.

Figure 5:
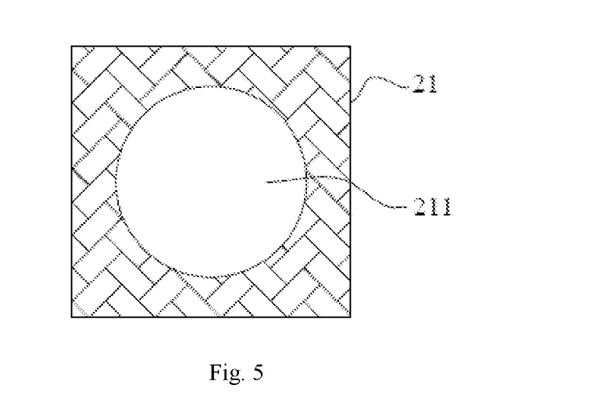
FIG. 5 is a schematic diagram of a second pad of the second die in a semiconductor device manufacturing method in accordance with one embodiment of this inventive concept.

In one example, as shown in FIGS. 4 and 5, the second die 2 may have the second pad 21, a second substrate 22 and a second insulating layer 23.

The second substrate 22 may be made of the same material as the first substrate 12.

The second insulating layer 23 may be disposed on the second substrate 22 and may be made of the same material as the first insulating layer 13.

The second pad 21 may be disposed on the side of the second insulating layer 23 farthest away from the second substrate 22. The second pad 21 may be embedded in the second insulating layer 23, with its upper surface flush with a surface of the second insulating layer 23 facing away from the second substrate 22. The second pad 21 may be made of a metallic material such as copper, aluminum or tungsten. Apparently, the second pad 21 may also be made of other metallic materials not enumerated herein. The second pad 11 may be rectangular, circular or other suitable shapes in a plan view.

The number of the second pads 21 in each second die 2 may be equal to the number of the first pads 11 in the first die 1. That is, each second pad 21 in a second die 2 may correspond to a first pad 11 in the first die 1. Each of the second pads 21 may have a through hole 211. The through hole 211 may be a circular, rectangular or other shape in a plan view.

The through holes 211 may have at least two different sizes. However, in case a second die 2 has multiple through holes 211, then the multiple through holes 211 in this second die 2 may have a same size. Through holes 211 in different second dies 2 may have different sizes. Each of the second pads 21 may have a same thickness as the first pad 11.

Figure 6:
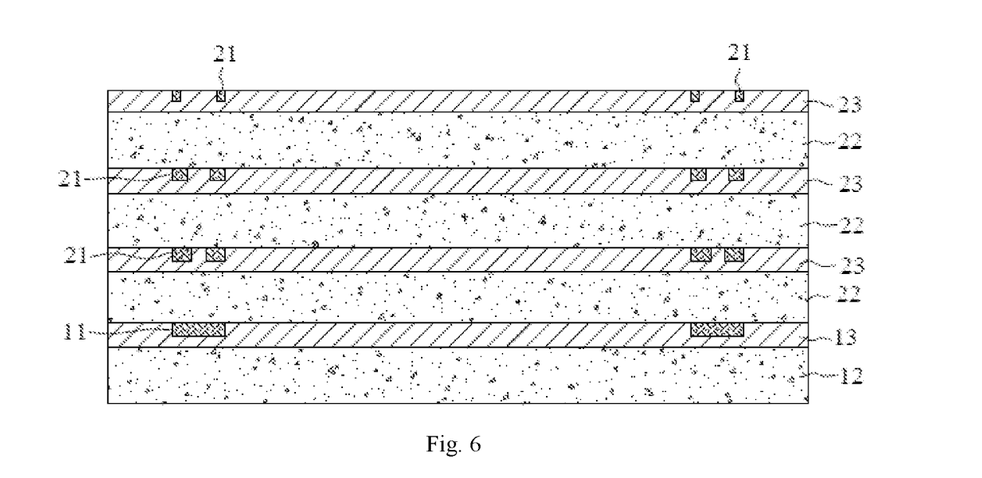
FIG. 6 is a schematic diagram illustrating a structure after step S120 of a semiconductor device manufacturing method in accordance with one embodiment of this inventive concept.

As shown in FIG. 6, in step S120, the plurality of second dies 2 may be stacked on the first die 1, with the second pads 21 aligned with the first pad 11. In any two adjacent second dies 2, the through hole 211 closer to the first die 1 may not be larger than the through hole farther away from the first die 1.

In one example, one second die 2 may first be stacked on the first die 1, then other second dies 2 may be successively staked on that second die 2, thereby forming a stacked structure. During the successive stacking process, two adjacent dies, such as the first die 1 and the second die 2 stacked on the first die 1, and adjacent two second dies 2, may be bonded together. For example, the second insulating layers 23 and second substrates 22 may be alternately stacked on the surface of the first insulating layer 13 facing away from the first substrate 12, with the second substrate 22 of the second die 2 closest to the first die 1 bonded to the surface of the first insulating layer 13 facing away from the first substrate 12. In any two adjacent second dies 2, the second insulating layer 23 of the underlying second die 2 may be boned to the second substrate 22 of the overlying second die 2.

In the dies in the stacked structure, the second pads 21 may be aligned with the first pad 11. In other words, the second pads 21 and the first pads 11 may be aligned along a line perpendicular to an upper surface of the first substrate 12. Additionally, centers of the through holes 211 of the second pads 21 and a center of the first pad 11 may be collinear. In case of multiple second pads 21 being provided in each of the second dies 2 and multiple first pads 11 being provided in the first die 1, each of the first pads 11 in the first die 1 may align with a unique second pad 21 (and therefore a unique through hole 211) in each of the second dies 2.

In one example, the first pad 11 and the second pads 21 may have the same shape and size, and the centers of the through holes 211 of the second pads 21 and the center of the first pad 11 may be collinear in a line perpendicular to the upper surface of the first substrate 12.

In the dies in the stacked structure, in any two adjacent second dies 2, the through hole 211 closer to the first die 1 may not be larger than the through hole 211 farther away from the first die 1. In one example, all the through holes 211 in the second dies 2 may be circular in a plan view, and different second dies 2 may have through holes 211 of different diameters. As a result, the diameter of the through hole 211 may increase along a direction perpendicular to the upper surface of the first substrate 12 and pointing away from the first die 1. In other words, when stacking the plurality of second dies 2 on the first die 1, the second dies 2 may be stacked according to the diameters of through holes 211 from the smallest diameter to the largest diameter.

Referring to FIG. 1, in step S130, a connecting hole 3 passing through the through holes 211 may be formed. The connecting hole 3 may expose the first pad 11, and include a plurality of hole sections each located in a corresponding second die 2. The hole section in a second die 2 may have a same size as the through hole 211 of the second pad 21 in this second die 2.

The connecting hole 3 may be formed by, for example, etching in a single perforation process. Apparently, the connecting hole 3 may also be formed through multiple perforation processes, but the number of the perforation processes conducted may be less than the number of second dies 2. Compared to conventional methods in which each die needs to be separately and individually perforated, the number of perforation processes in this method can be substantially reduced, which simplifies the manufacturing process and reduces the manufacturing cost.

Figure 7:
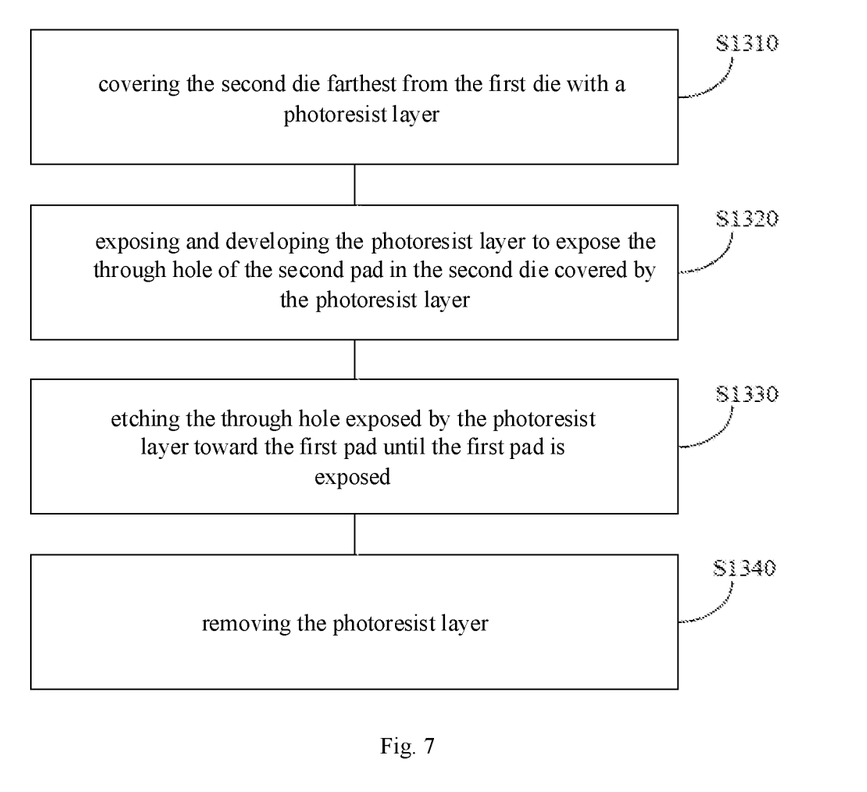
FIG. 7 is a flow diagram of step S130 of a semiconductor device manufacturing method in accordance with one embodiment of this inventive concept.
Figure 8:
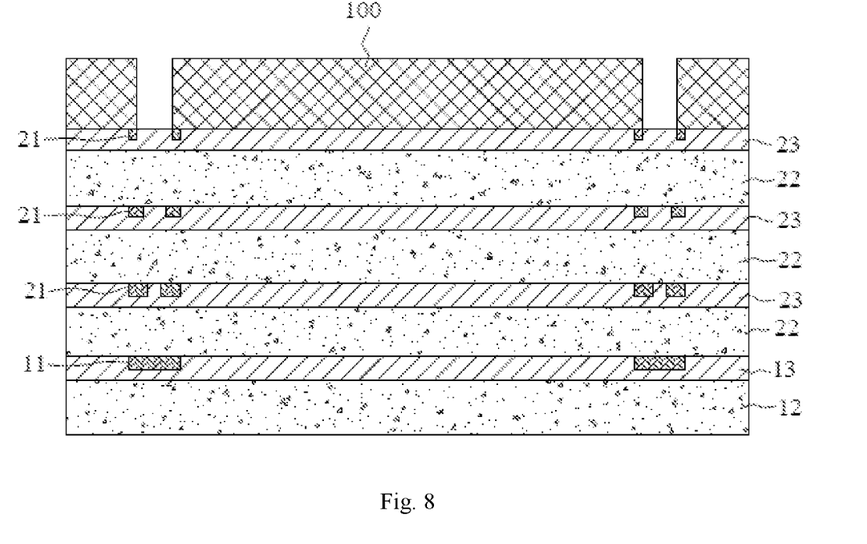
FIG. 8 is a schematic diagram illustrating a structure after step S1320 of a semiconductor device manufacturing method in accordance with one embodiment of this inventive concept.

In some embodiments, as shown in FIGS. 7 and 8, step S130 may further include steps S1310 through S1340.

In step S1310, the second die 2 farthest from the first die 1 may be covered with a photoresist layer 100.

The photoresist layer 100 may be a positive photoresist or a negative photoresist. This inventive concept is not limited in this regard.

In step S1320, the photoresist layer 100 may be exposed and developed to expose the through hole 211 of the second pad 21 in the second die 2 covered by the photoresist layer 100.

The photoresist layer 100 may be exposed and developed with the aid of a photomask, so that at least the through hole 211 of the second pad 21 in the second die 2 directly covered by the photoresist layer 100 (i.e., the through hole 211 of the second pad 21 in the second die 2 farthest from the first die 1) is exposed. Alternatively, the entire second pad 21 in the second die 2 directly covered by the photoresist layer 100 may be exposed.

In step S1330, the through hole 211 exposed by the photoresist layer 100 may be etched toward the first pad 11 until the first pad 11 is exposed.

The etching process performed in the through hole 211 exposed by the photoresist layer 100 may be a dry etching process, which may proceed gradually toward the first pads 11 aligned with the through hole 211 until the first pad 11 is exposed. Thus, a connecting hole 3 passing through the through holes 211 may be formed through one single etching process. Since the first pad 11 and the second pads 21 may both be made of copper, they will not be removed during the drying etching process. Therefore, only the material in the through holes 211 will be removed. Apparently, other suitable etching methods may be used to form the connecting hole 3. This inventive concept is not limited in this regard.

The connecting hole 3 may comprise a plurality of hole sections each located in a corresponding second die 2. The hole section in a second die 2 may have a same size as the through hole 211 of the second pad 21 in this second die 2. The through holes 211 of different second dies 2 may have different sizes, and the size of the through hole may gradually decrease along a direction perpendicular to an upper surface of the first die 1 and pointing toward the first die 1. Correspondingly, the various hole sections may also have different sizes, and the size of a hole section may gradually decrease toward the exposed first pad 11. That is, a size of a cross section of the connecting hole 3 parallel with the upper surface of the first pad 11 may gradually decrease while the cross section moving toward the first pad 11.

Figure 9:
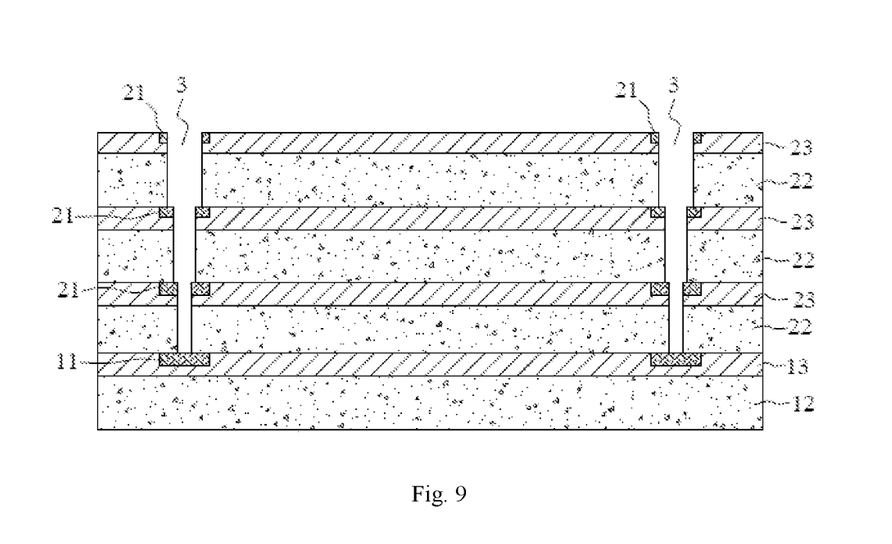
FIG. 9 is a schematic diagram illustrating a structure after step S1340 of a semiconductor device manufacturing method in accordance with one embodiment of this inventive concept.

As shown in FIG. 9, in step S1340, the photoresist layer 100 may be removed.

The photoresist layer 100 may be removed by a stripping solution, an ashing process or any other suitable technique. This inventive concept is not limited in this regard.

As shown in FIG. 1, in step S140, a conductive body 4 (shown in FIG. 16) connecting the first pad 11 and the second pads 21 may be formed in the connecting hole 3.

Figure 16:
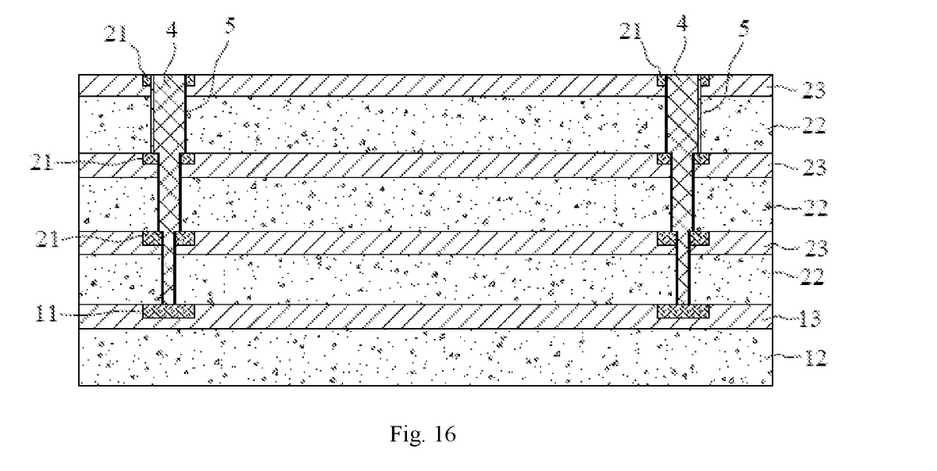
FIG. 16 is a schematic diagram illustrating a semiconductor device in accordance with one embodiment of this inventive concept.

The conductive body 4 may be made of a metallic material such as copper, aluminum, tungsten, or any other suitable metallic material, which are not exhaustively enumerated herein. To make the conductive body 4 have a same conductivity characteristic as the first pad 11 and the second pads 21, the conductive body 4 may be made of a same material as the first pad 11 and the second pads 21. For example, the conductive body 4, the first pad 11, and the second pads 21 may all be made of copper. The conductive body 4 may connect the first pad 11 to the second pads 21 aligned therewith so that the connection between the first pad 11 and the second pads 21 may be achieved, thereby achieving a connection between the first die 1 and the second dies 2.

Figure 10:
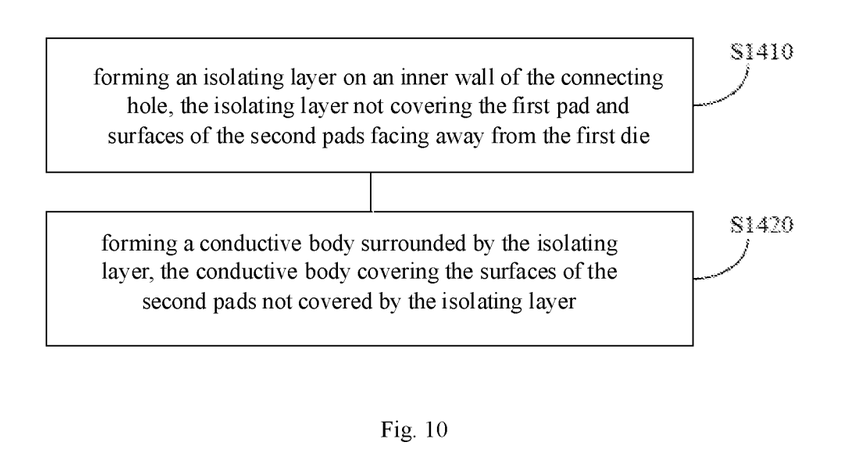
FIG. 10 is a flow diagram of step S140 of a semiconductor device manufacturing method in accordance with one embodiment of this inventive concept.

In some embodiments, as shown in FIG. 10, step S140 may include steps S1410 and S1420.

In step S1410, an isolating layer 5 may be formed on an inner wall of the connecting hole 3. The isolating layer 5 may not cover the first pad 11 and surfaces of the second pads 21 facing away from the first die 1.

The isolating layer 5 may consist of a single layer of silica, silicon nitride or any other suitable insulating material. Apparently, the isolating layer 5 may also consist of multiple layers. For example, the isolating layer 5 may consist of an insulating layer and a barrier layer. The insulating layer may be directly formed on the inner wall of the connecting hole 3, and the barrier layer may be formed on an inner wall of the insulating layer. The barrier layer may prevent outward diffusion of the conductive body 4 and therefore improve electrical reliability and stability of the dies. The material of the barrier layer may depend on the material of the conductive body 4. For example, when the conductive body 4 is formed of copper, the material of the barrier layer may be titanium, tantalum or any other suitable material that provides the aforementioned barrier function.

Figure 11:
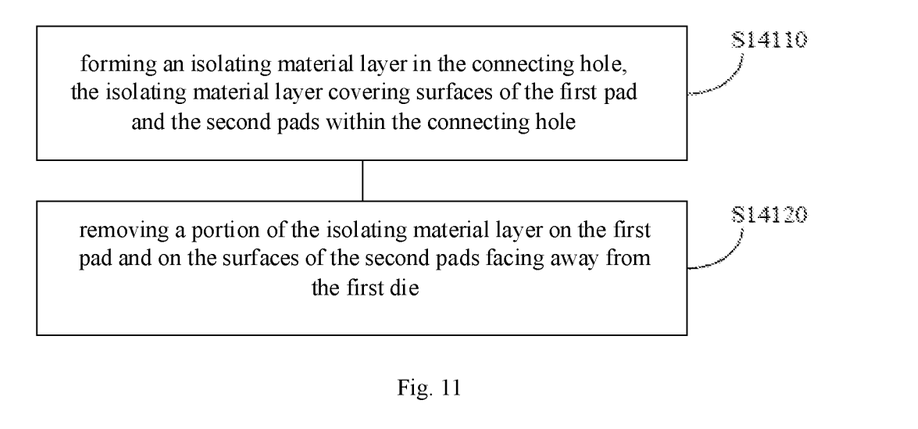
FIG. 11 is a flow diagram of step S1410 of a semiconductor device manufacturing method in accordance with one embodiment of this inventive concept.

In some embodiments, the isolating layer 5 may have a single-layer structure. The through holes 211 on different second dies 2 may have different sizes, with the though hole 211 on a second die 2 farther away from the first die 1 having a larger size. As shown in FIG. 11, the step S1410 may include steps S14110 and S14120.

Figure 12:
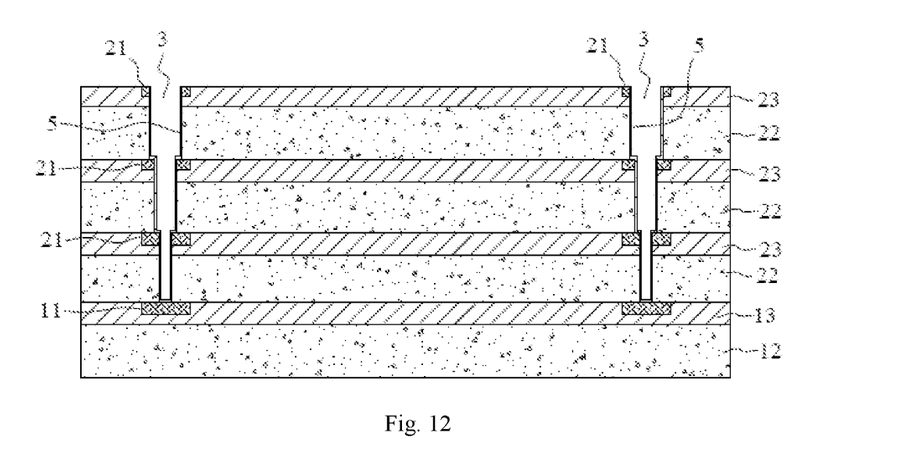
FIG. 12 is a schematic diagram illustrating a structure after step S14110 of a semiconductor device manufacturing method in accordance with one embodiment of this inventive concept.

As shown in FIG. 12, in step S14110, an isolating material layer may be formed in the connecting hole 3, the isolating material layer covering surfaces of the first pad 11 and the second pads 21 within the connecting hole 3.

The isolating material layer may be made of silica. In this case, silica may be deposited on the second insulating layer 23 of the second die 2 that is farthest from the first die 1. The isolating material layer deposited in the connecting hole 3 may cover surfaces of the first pad 11 and the second pads 21 within the connecting hole 3 so as to entirely cover the inner wall of the connecting hole 3.

Figure 13:
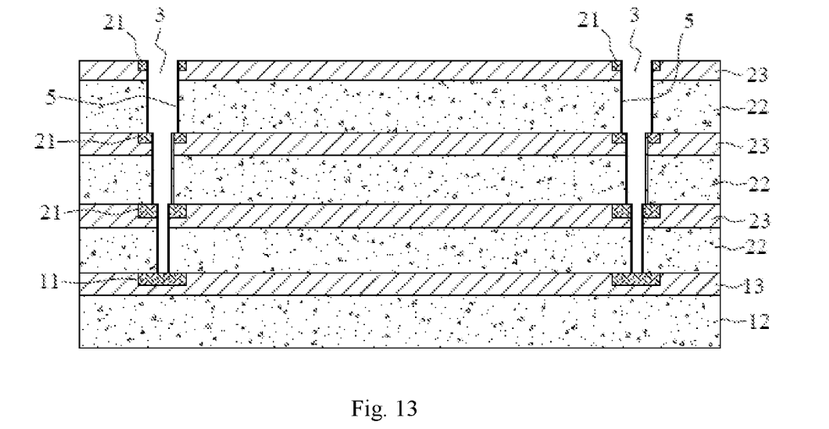
FIG. 13 is a schematic diagram illustrating a structure after step S14120 of a semiconductor device manufacturing method in accordance with one embodiment of this inventive concept.

As shown in FIG. 13, in step S14120, a portion of the isolating material layer on the first pad 11 and on the surfaces of the second pads 21 facing away from the first die 1 may be removed.

The portion of the isolating material layer covering the first pad 11 may be removed with an etchant solution so that at least part of the first pad 11 is exposed, enabling the connection of the conductive body 4 with the first pad 11. Meanwhile, the portion of the isolating material layer deposited on the surfaces of the second pads 21 facing away from the first die 1 may be removed, so as to expose surfaces of the second pads 21 facing away from the first die 1 in the connecting hole 3, thereby allowing the conductive body 4 to connect the respective second pads 21.

In some embodiments, in two adjacent second dies 2, the through hole 211 of the second pad 21 in one second die 2 may be the same as the through hole 211 of the second pad 21 in the other second die 2. In this case, in order to allow the connection between the conductive body 4 and those two second pads 21, openings may be formed by perforation or other suitable methods in the side surfaces of the second pads 21 near a central axis of the connecting hole 3. Specific methods that may be used to form the openings are not limited in this inventive concept.

As shown in FIG. 10, in step S1420, a conductive body 4 surrounded by the isolating layer 5 may be formed. The conductive body 4 may cover the surfaces of the second pads 21 not covered by the isolating layer 5.

Figure 14:
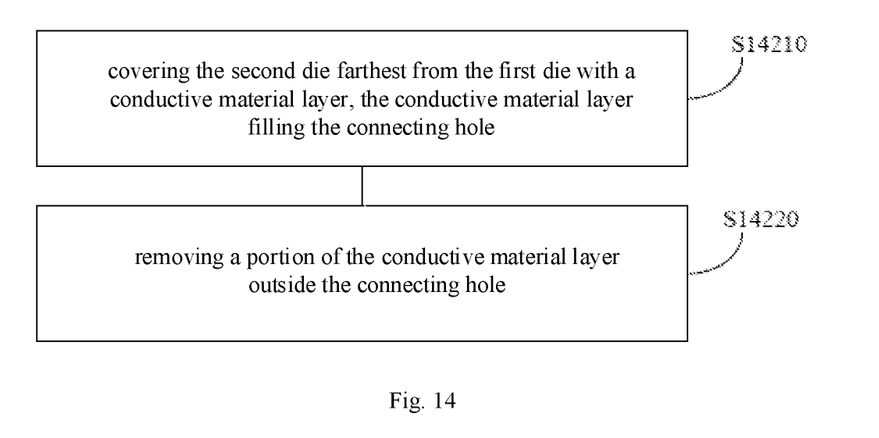
FIG. 14 is a flow diagram of step S1420 of a semiconductor device manufacturing method in accordance with one embodiment of this inventive concept.

The space delimited by the isolating layer 5 may be filled with a conductive material. The conductive material may cover the exposed portions of the first pad 11 and the second pads 21 to form the conductive body 4. The conductive body 4 may have a shape matched with the connecting hole 3. In one example, as shown in FIG. 14, step S1420 may include steps S14210 and S14220.

Figure 15:
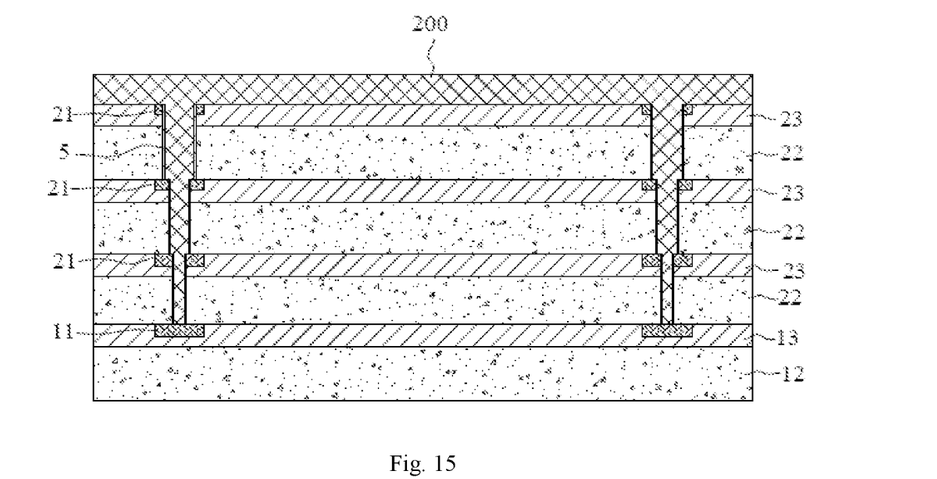
FIG. 15 is a schematic diagram illustrating a structure after step S14210 of a semiconductor device manufacturing method in accordance with one embodiment of this inventive concept.

As shown in FIG. 15, in step S14210, the second die 2 farthest from the first die 1 may be covered with a conductive material layer 200, and the conductive material layer 200 may fill the connecting hole 3.

The conductive material layer 200 may be formed by sputtering, electroplating, evaporation or any other suitable process. This inventive concept is not limited in this regard. The portion of the conductive material layer 200 filling the connecting hole 3 may cover the exposed portions of the first pad 11 and the second pads 21 so that the first pad 11 and the second pads 21 may be connected by the conductive material layer 200.

As shown in FIG. 16, in step S14220, a portion of the conductive material layer 200 outside the connecting hole 3 may be removed.

The removal of the portion of the conductive material layer 200 outside the connecting hole 3 may be accomplished by chemical mechanical polishing or other suitable methods so that the remaining of the conductive material layer 200 within the connecting hole 3 forms the conductive body 4.

This inventive concept further provides a semiconductor device. As shown in FIG. 16, the semiconductor device may include a first die 1, a plurality of second dies 2, a connecting hole 3 and a conductive body 4.

The first die 1 may have a first pad 11.

The number of the second dies 2 may be more than one. Each of the second dies 2 may have a second pad 21, and each of the second pads may have a through hole 211.

The second dies 2 may be stacked on the first die 1 with the second pads 21 aligned with the first pad 11. In any two adjacent second dies 2, the through hole 211 closer to the first die 1 may not be larger than the through hole 211 farther away from the first die 1.

The connecting hole 3 may pass through the through holes 211 and expose the first pad 11. The connecting hole 3 may include a plurality of hole sections each located in a corresponding second die 2, and the hole section in a second die may have a same size as the through hole 211 of the second pad 21 in this second die 2.

The conductive body 4 may be formed in the connecting hole 3 and may connect the first pad 11 and the second pads 21.

In the semiconductor device disclosed herein, the first die 1 and the second dies 2 may be connected by the conductive body 4 in the connecting hole 3, and a through hole 211 closer to the first die 1 may not be larger than another through hole 211 farther away from the first die 1. Therefore, the connecting hole 3 exposing the first pad may be directly formed along a direction perpendicular to an upper surface of the first die 1 and toward the first die 1. Thus the second dies 2 do not need to be separately and individually perforated, and the number of required perforation processes may be substantially reduced, which simplifies the manufacturing process, reduces the manufacturing cost, and improves the production yield.

In some embodiments, the semiconductor device may further include an isolating layer 5 disposed between an inner wall of the connecting hole 3 and the conductive body 4. The isolating layer 5 may not cover the first pad 11 and the surfaces of the second pads 21 facing away from the first die 1. The isolating layer 5 may prevent outward diffusion of the conductive body 4 and may improve electrical reliability and stability of the dies.

As various components of the semiconductor device have been described in details hereinabove in connection with the description of the semiconductor device manufacturing method, a further detailed description is therefore omitted for the sake of concision.

This inventive concept further provides a memory device incorporating the semiconductor device of any of the aforementioned embodiments. The memory device may be a DRAM, NAND flash memory or the like.

Other embodiments of the present disclosure will be apparent to those skilled in the art from considering the specification and practicing the invention disclosed herein. Accordingly, this disclosure is intended to cover all and any variations, uses, or adaptations of the disclosure which follow, in general, the principles thereof and include such departures from the present disclosure as come within common knowledge or customary practice within the art to which the invention pertains. It is also intended that the specification and examples be considered as exemplary only, with true scope and spirit of the disclosure being indicated by the appended claims.

The invention claimed is:

1. A semiconductor device manufacturing method, comprising:
    providing a first die and a plurality of second dies, the first die having a first pad, each of the plurality of second dies having a second pad, and each of the second pads having a through hole;
    stacking the plurality of second dies on the first die, the second pads aligned with the first pad, wherein in any two adjacent second dies, the through hole closer to the first chip is not larger than the through hole farther away from the first die;
    forming a connecting hole, the connecting hole passing through the through holes, exposing the first pad, and comprising a plurality of hole sections each located in a corresponding second die, wherein the hole section in a second die has a same size as the through hole of the second pad in this second die;
    forming an isolating layer on an inner wall of the connecting hole, the isolating layer comprising a side insulating layer and a barrier layer made of different non-conductive materials, the side insulating layer formed directly on the inner wall of the connecting hole, the barrier layer formed directly on an inner wall of the side insulating layer, the isolating layer not covering the first pad and surfaces of the second pads facing away from the first die; and
    forming a conductive body surrounded by the isolating layer, the conductive body covering surfaces of the second pads not covered by the isolation layer, and connecting the first pad and the second pads in the connecting hole.

2. The method of claim 1, wherein the connecting hole is formed by a single perforation process.

3. The method of claim 2, wherein the forming a connecting hole comprises:
    covering the second die farthest from the first die with a photoresist layer;
    exposing and developing the photoresist layer to expose the through hole of the second pad in the second die covered by the photoresist layer;
    etching the through hole exposed by the photoresist layer toward the first pad until the first pad is exposed; and
    removing the photoresist layer.

4. The method of claim 1, wherein the through holes of different second pads have different sizes.

5. The method of claim 4, wherein the forming an isolating layer on an inner wall of the connecting hole comprises:
    forming an isolating material layer in the connecting hole, the isolating material layer covering surfaces of the first pad and the second pads within the connecting hole; and
    removing a portion of the isolating material layer on the first pad and on the surfaces of the second pads facing away from the first die.

6. The method of claim 4, wherein the forming a conductive body surrounded by the isolating layer comprises:
    covering the second die farthest from the first die with a conductive material layer, the conductive material layer filling the connecting hole; and
    removing a portion of the conductive material layer outside the connecting hole.

7. The method of claim 1, wherein centers of the through holes and a center of the first pad are collinear.

8. The method of claim 1, wherein the first pad and the second pads are each made of a metallic material.

9. The method of claim 8, wherein the first pad and the second pads are each made of any one of copper, aluminum and tungsten.

10. The method of claim 1, wherein the first die comprises:
a first substrate; and
a first insulating layer disposed on the first substrate, wherein the first pad is embedded in a surface of the first insulating layer facing away from the first substrate,
wherein each of the plurality of second dies comprises:
a second substrate; and
a second insulating layer disposed on a side of the second substrate farthest away from the first die, wherein the second pad is embedded in a surface of the second insulating layer facing away from the second substrate,
and wherein the second substrate of the second die closest to the first die is disposed on the surface of the first insulating layer facing away from the first substrate, and the second substrates and the second insulating layers of the second dies are stacked alternately one above another.

11. The method of claim 1, wherein the conductive body is a Through-Silicon Via (TSV).

12. A semiconductor device, comprising:
a first die having a first pad;
a plurality of second dies, each having a second pad, each of the second pads having a through hole, wherein the second dies are stacked on the first die with the second pads aligned with the first pad, and in any two adjacent second dies, the through hole closer to the first die is not larger than the through hole farther away from the first die;
a connecting hole passing through the through holes, exposing the first pad, and comprising a plurality of hole sections each located in a corresponding second die, wherein the hole section in a second die wafer has a same size as the through hole of the second pad in this second die;
an isolating layer on an inner wall of the connecting hole, the isolating layer comprising a side insulating layer and a barrier layer made of different non-conductive materials, the side insulating layer formed directly on the inner wall of the connecting hole, the barrier layer formed directly on an inner wall of the side insulating layer, the isolating layer not covering the first pad and surfaces of the second pads facing away from the first die; and
a conductive body surrounded by the isolating layer, the conductive body covering surfaces of the second pads not covered by the isolating layer, and connecting the first pad and the second pads in the connecting hole.

13. The semiconductor device of claim 12, wherein the through holes of different second pads have different sizes.

14. The semiconductor device of claim 12, wherein centers of the through holes and a center of the first pad are collinear.

15. The semiconductor device of claim 12, wherein the first pad and the second pads are each made of a metallic material.

16. The semiconductor device of claim 15, wherein the first pad and the second pads are each made of any one of copper, aluminum and tungsten.

17. The semiconductor device of claim 12, wherein the first die comprises:
a first substrate; and
a first insulating layer disposed on the first substrate, wherein the first pad is embedded in a surface of the first insulating layer facing away from the first substrate,
wherein each of the plurality of second dies comprises:
a second substrate; and
a second insulating layer disposed on a side of the second substrate farthest away from the first die, wherein the second pad is embedded in a surface of the second insulating layer facing away from the second substrate,
and wherein the second substrate of the second die closest to the first die is disposed on the surface of the first insulating layer facing away from the first substrate, and wherein the second substrates and the second insulating layers of the second dies are stacked alternately one above another.

18. The semiconductor device of claim 12, wherein the conductive body is a Through-Silicon Via (TSV).

19. A memory device, comprising the semiconductor device of claim 12.

* * * * *

UNITED STATES PATENT AND TRADEMARK OFFICE
CERTIFICATE OF CORRECTION

Page 1 of 1

PATENT NO. : 11,462,514 B2
APPLICATION NO. : 17/182063
DATED : October 4, 2022
INVENTOR(S) : Chih-Wei Chang It is certified that error appears in the above-identified patent and that said Letters Patent is hereby corrected as shown below:

On the Title Page

Item (30) Foreign Application Priority Data:
Aug. 31, 2018 (CN) ............................ 201811015658.X
Aug. 31, 2018 (CN) ............................ 201821424715.4

Should read:
Aug. 31, 2018 (CN) ............................ 201811015658.4
Aug. 31, 2018 (CN) ............................ 201821424715.X Signed and Sealed this
Tenth Day of January, 2023

Katherine Kelly Vidal
*Director of the United States Patent and Trademark Office*